United States Patent
Raj (10) Patent No.: US 10,014,868 B1
(45) Date of Patent: Jul. 3, 2018

(54) INJECTION-LOCKED PHASE INTERPOLATOR

(71) Applicant: Xilinx, Inc., San Jose, CA (US)

(72) Inventor: Mayank Raj, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/476,861

(22) Filed: Mar. 31, 2017

(51) Int. Cl.
*H03L 7/099* (2006.01)
*H03B 27/00* (2006.01)

(52) U.S. Cl.
CPC .......... *H03L 7/0998* (2013.01); *H03L 7/0995* (2013.01); *H03L 2207/06* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,565,817 | A * | 10/1996 | Lakshmikumar | H03K 3/0315 327/237 |
| 7,061,334 | B1 * | 6/2006 | Baig | G06F 1/04 331/177 R |
| 8,860,512 | B2 * | 10/2014 | Schimper | H03K 3/0315 327/158 |
| 9,178,498 | B2 * | 11/2015 | Chong | H03K 3/0322 |

OTHER PUBLICATIONS

Raj, Mayank et al., "A Wideband Injection Locked Quadrature Clock Generation and Distribution Technique for an Energy-Proportional 16-32 Gb/s Optical Receiver in 28 nm FDSOI CMOS," in IEEE Journal of Solid-State Circuits, vol. 51, No. 10, pp. 2446-2462, Oct. 2016.

Shekhar, S. et al., "A 27Gb/s Forwarded-Clock I/O Receiver Using an Injection-Locked LC-DCO in 45nm CMOS," 2008 IEEE International Solid-State Circuits Conference—Digest of Technical Papers, San Francisco, CA, 2008, pp. 152-627.

* cited by examiner

*Primary Examiner* — An Luu
(74) *Attorney, Agent, or Firm* — Robert M. Brush (57) ABSTRACT

An example phase interpolator includes: a ring oscillator having a plurality of delay stages and a plurality of injection switches, each of the plurality of injection switches responsive to a differential reference clock signal and a first differential control signal; a supply control circuit configured to provide a regulated supply voltage to the ring oscillator in response to a first component of a second differential control signal; and a ground control circuit configured to provide a regulated ground voltage to the ring oscillator in response to a second component of the second differential control signal.

20 Claims, 8 Drawing Sheets

INJECTION-LOCKED PHASE INTERPOLATOR

TECHNICAL FIELD

Examples of the present disclosure generally relate to electronic circuits and, in particular, to an injection-locked phase interpolator.

BACKGROUND

In a transceiver, such as a serializer/deserializer (SERDES), a dock delivery system can include a phase-locked loop (PLL) that generates one or more dock signals for use in transmitting and receiving data. A phase interpolator (PI) can be used to interpolate a dock signal by shifting its phase by a discrete amount over a given range. In a receiver, a PI is used to adjust the phase of the sampling dock used to sample the received data.

Conventional PIs tend to consume significant power, which may present challenges in low-power applications. An injection-locked oscillator (ILO) based PI is a low-power alternative. However, a conventional ILO-based PI has a limited range, especially across process, voltage, and temperature (PVT) variations. It is desirable to provide a PI that consumes less power than conventional PIs while having increased range as compared to conventional ILO-based PIs.

SUMMARY

In an example, a phase interpolator includes: a ring oscillator having a plurality of delay stages and a plurality of injection switches, each of the plurality of injection switches responsive to a differential reference clock signal and a first differential control signal; a supply control circuit configured to provide a regulated supply voltage to the ring oscillator in response to a first component of a second differential control signal; and a ground control circuit configured to provide a regulated ground voltage to the ring oscillator in response to a second component of the second differential control signal.

In another example, a receiver includes: sampling circuitry configured to sample an input signal based on a plurality of sampling clock signals; a clock and data recovery (CDR) circuit configured to generate a control signal in response to data and error samples output by the sampling circuitry; a clock generator configured to generate the plurality of sampling clock signals; and a phase interpolator configured to provide a plurality of clock signals to the clock generator in response to the control signal from the CDR circuit. The phase interpolator includes: a ring oscillator having a plurality of delay stages and a plurality of injection switches, each of the plurality of injection switches responsive to a differential reference clock signal and a first differential control signal; a supply control circuit configured to provide a regulated supply voltage to the ring oscillator in response to a first component of a second differential control signal; and a ground control circuit configured to provide a regulated ground voltage to the ring oscillator in response to a second component of the second differential control signal.

In another example, a method of phase interpolation includes: providing a differential reference clock signal and a first differential control signal to a plurality of injection switches in a ring oscillator; providing a regulated supply voltage to the ring oscillator in response to a first component of a second differential control signal; and providing a regulated ground control voltage to the ring oscillator in response to a second component of the second differential control signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for providing an injection-locked phase interpolator are described. In an example, the phase interpolator includes a divide-by-two injection-locked oscillator (ILO) that increases the deskew range by a factor of two across process, voltage, and temperature (PVT) variations while generating a four-phase in-phase (I) and quadrature (Q) clock. In addition, the divide-by-two ILO guarantees the quadrature accuracy. In an example, the phase interpolator includes a ring oscillator having a plurality of delay stages and a plurality of injection switches, where each of the plurality of injection switches responsive to a differential reference clock signal and a first differential control signal.

A supply control circuit is configured to provide a regulated supply voltage to the ring oscillator in response to a first component of a second differential control signal. A ground control circuit configured to provide a regulated ground voltage to the ring oscillator in response to a second component of the second differential control signal.

The techniques described herein can be further understood with reference to basic ILO theory. The phase deskew (θ) from an ILO is dependent on the difference of the natural frequency of the VCO ($f_0$) and the injected frequency ($f_{inj}$). In particular, if $f_1$ is in the locking range, then the following holds true:

$$\theta = \sin^{-1}\left(\frac{f_0 - f_{inj}}{f_1}\right).$$

Here, θ represents the phase shift of the ILO output with respect to the injecting clock. Now maximum deskew is fixed to ±90° from the equation above. However, given a lower frequency, there is more time to deskew the output clock. In particular, as employed by the techniques described herein, if the $f_0$ of a divide-by-two ILO is altered, then the deskew time is doubled for the same phase shift, as compared to an ILO with no division. Apart from doubling the deskew range, the techniques described herein also exploit the symmetric injection of a four-stage ring oscillator to avoid any tradeoff between the amount of deskew and quadrature accuracy. This allows generation of an accurate four-phase IQ clock for all amounts of deskew. These and further aspects are described below with respect to the drawings.

Figure 1:
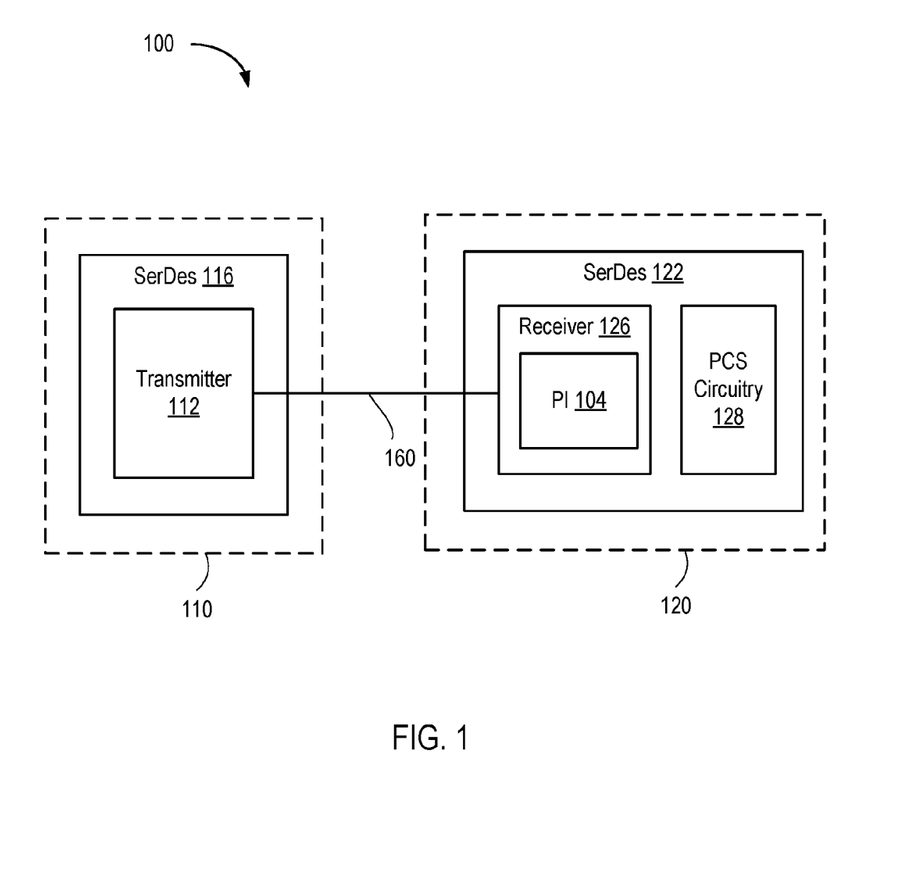
FIG. 1 is a block diagram depicting an example of a serial communication system.

FIG. 1 is a block diagram depicting an example of a serial communication system 100. The serial communication system 100 comprises a transmitter 112 coupled to a receiver 126 over transmission medium 160. The transmitter 112 can be part of a serializer-deserializer (SerDes) 116. The receiver 126 can be part of a SerDes 122. The transmission medium 160 comprises an electrical path between the transmitter 112 and the receiver 126 and can include printed circuit board (PCB) traces, vias, cables, connectors, decoupling capacitors, and the like. The receiver of the SerDes 116, and the transmitter of the SerDes 122, are omitted for clarity. In some examples, the SerDes 116 can be disposed in an integrated circuit (IC) 110, and the SerDes 122 can be disposed in an IC 120.

The transmitter 112 drives serial data onto the transmission medium 160 using a digital baseband modulation technique. In general, the serial data is divided into symbols. The transmitter 112 converts each symbol into an analog voltage mapped to the symbol. The transmitter 112 couples the analog voltage generated from each symbol to the transmission medium 160. In some examples, the transmitter 112 uses a binary non-return-to-zero (NRZ) modulation scheme. In binary NRZ, a symbol is one bit of the serial data and two analog voltages are used to represent each bit. In other examples, the transmitter uses multi-level digital baseband modulation techniques, such as pulse amplitude modulation (PAM), where a symbol includes a plurality of bits of the serial data and more than two analog voltages are used to represent each bit.

The receiver 126 receives an analog signal from the transmission medium 160. The receiver 126 includes a phase interpolator (PI) 104 for generating clocks to sample the analog signal. In an example, the PI 104 is a divider-based injection-locked oscillator (ILO). For example, the PI 104 can be a divide-by-two ILO that generates a four-phase clock (e.g., 0, 90, 180, and 270 degree phases). The receiver 126 provides recovered data to physical coding sublayer (PCS) circuitry 128 in SerDes 122 for decoding and further processing.

Figure 2:
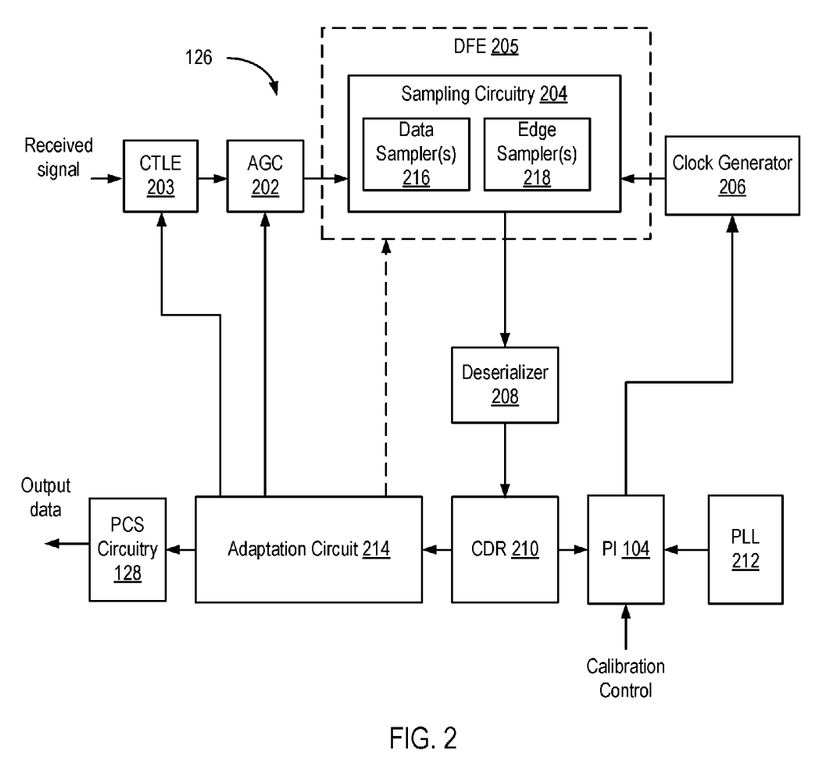
FIG. 2 is a block diagram depicting a receiver according to an example.

FIG. 2 is a block diagram depicting the receiver 126 according to an example. The receiver 126 includes a continuous time linear equalizer (CTLE) 203, an automatic gain control (AGC) circuit 202, sampling circuitry 204, deserializer 208, a clock and data recovery (CDR) circuit 210, the phase interpolator (PI) 104, a clock generator 206, and an adaptation circuit 214. An output of the CTLE 203 is coupled to an input of the AGC circuit 202. An output of the AGC circuit 202 is coupled to inputs of the sampling circuitry 204. An output of the clock generator 206 is coupled to inputs of the sampling circuitry 204. An output the sampling circuitry 204 is coupled to an input of the deserializer 208. An output of the deserializer 208 is coupled to an input of the CDR circuit 210. Outputs of the CDR circuit 210 are coupled to an input of the adaptation circuit 214 and an input of the PI 104, respectively. Another input of the PI 104 is coupled to an output of a phase locked loop (PLL) circuit 212. In an example, an output of the PI 104 is coupled to an input of the clock generator 206. An output of the clock generator 206 is coupled to an input of the sampling circuitry 204. Outputs of the adaptation circuit 214 are coupled to the CTLE 203, the AGC circuit 202, and the PCS circuitry 128, respectively. In an example, the sampling circuitry 204 can be part of a decision feedback equalizer (DFE) 205. In such case, another output of the adaptation circuit 214 is coupled to the DFE 205.

In operation, the CTLE 203 receives an analog signal from the transmission medium 160. The CTLE 203 operates as a high-pass filter to compensate for the low-pass characteristics of the transmission medium 160. The peak of the frequency response of the CTLE 203 can be adjusted based on a CTLE adjust signal provided by the adaptation circuit 214. The AGC circuit 202 receives the equalized analog signal from the CTLE 203. The AGC circuit 202 adjusts the gain of the equalized signal based on a gain adjust signal provided by the adaptation circuit 214. In another example, the AGC circuit 202 can precede the CTLE circuit 203.

The sampling circuitry 204 generates data and crossing samples from the output of the AGC circuit 202 based in-phase (I) and quadrature (Q) clock signals output by the clock generator 206. The sampling circuitry 204 can generate the data samples using the I clock signal and the crossing samples using the Q clock signal. In example, the sampling circuitry 204 is part of the DFE 205. The DFE 205 equalizes the output of the AGC circuit 202 to minimize inter-symbol interference (ISI). The sampling circuitry 204 can include one or more data samplers 216 configured to generate data samples based on the I clock signal, and one or more edge samplers 218 configured to generate crossing samples based on the Q clock signal.

Each data and crossing sample includes one or more bits depending on the type of modulation scheme employed (e.g., one bit samples for binary NRZ and multi-bit samples for PAM). The deserializer 208 groups data samples and crossing samples to generate a deserialized signal. The deserializer 208 unifies the two separate parallel data and crossing sample streams into a deserialized signal to be processed by the CDR circuit 210.

The CDR circuit 210 generates a PI control signal from the deserialized signal generated by the deserializer 208. The PI 104 receives the PI control signal from the CDR circuit 210 and a reference clock signal from the PLL 212. The PI 104 outputs a plurality of clock signals in response to the PI control signal and the reference clock signal. For example, the PI 104 can output four clock signals to the clock generator 206 successively shifted in phase by 90 degrees (e.g., 0, 90, 180, and 270 degree phases). The clock generator 206 generates the I and Q sampling clock signals from the clock signals output by the PI 104.

The CDR circuit 210 outputs a data signal to the adaptation circuit 214. The data signal includes the data samples output by the sampling circuitry 204. The adaptation circuit 214 generates control signals for the CTLE 203 and the AGC circuit 202 based on data signal using known algorithms. If the DFE 205 is present, the adaptation circuit 214 generates a control signal for adjusting the taps of the DFE 205 using a known algorithm. The adaptation circuit 214 outputs the data signal to the PCS circuitry 128. The PCS circuitry 128 processes the data signal to recover the transmitted data.

Figure 3:
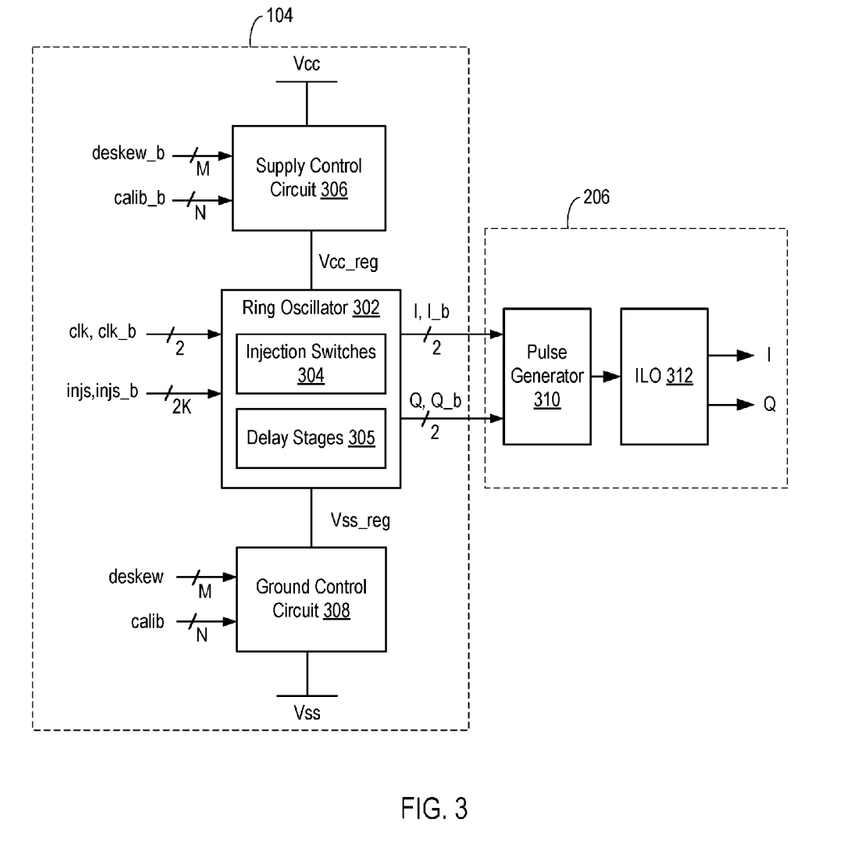
FIG. 3 is a block diagram depicting a phase interpolator and a clock generator according to an example.

FIG. 3 is a block diagram depicting the PI 104 and the clock generator 206 according to an example. The PI 104 includes a ring oscillator 302, a supply control circuit 306, and a ground control circuit 308. The clock generator 206 includes a pulse generator 310 and an ILO 312.

The supply control circuit 306 generates a voltage Vcc_reg from a supply voltage Vcc. The ground control circuit 308 generates a voltage Vss_reg from a ground voltage Vss. The supply control circuit 306 receives an M-bit signal, deskew_b, and an N-bit signal, calib_b, where M and N are positive integers. The ground control circuit 308 receives an M-bit signal, deskew, and an N-bit signal, calib. The M logic signals comprising the deskew signal are logical complements of the M logic signals comprising the deskew_b signal (denoted by the suffix "_b"). Likewise, the N logic signals comprising the calib signal are logical complements of the N logic signals comprising the calib_b input. The supply control circuit 306 generates the voltage Vcc_reg based on the deskew_b and calib_b signals, as described further below. The ground control circuit 308 generates the voltage Vss_reg based on the deskew and calib signals, as described further below. The deskew and deskew_b signals are provided by the CDR circuit 210. The calib and calib_b signals can be provided by the CDR 210 or by another control circuit (not shown).

The ring oscillator 302 includes a plurality of delay stages 305 and a plurality of injection switches 304. The ring oscillator 302 receives a differential clock comprising a clock signal clk and its logical complement clk_b. The ring oscillator 302 also receives a K-bit signal injs and its logical complement injs_b, where K is a positive integer. The ring oscillator 302 outputs an in-phase (I) clock and its logical complement I_b. The ring oscillator 302 also outputs a quadrature (Q) clock signal and its logical complement Q_b. The Q clock signal is ninety degrees out of phase with respect to the I clock signal. The ring oscillator 302 receives the supply voltage Vcc_reg from the supply control circuit 306 and the ground voltage Vss_reg from the ground control circuit 308. The ring oscillator 302 includes a plurality of injection switches 304 that inject the frequency of the clk signal into the ring oscillator 302. In examples discussed below, the ring oscillator 302 includes four delay stages 305 and two injection switches 304, where the injection switches 304 are positioned after the first and third delay stages. The injs signal controls the strength of the injection performed by the injection switches 304.

In operation, the CDR circuit 210 generates the differential deskew signal as at least a portion of the PI control signal. The differential deskew signal (deskew and deskew_b) controls the Vcc_reg and Vss_reg voltages, which in turn controls the oscillation frequency of the ring oscillator 302. By adjusting the Vcc_reg and Vss_reg voltages, the natural frequency of the ring oscillator 302 is changed. When the supply voltage applied to the ring oscillator 302 is reduced, the oscillation frequency is reduced and vice versa. Both the supply control circuit 306 and the ground control circuit 308 are controlled in unison so that the common mode of the output of the ring oscillator 302 remains at Vcc/2. This obviates the need for AC coupling of the output of the ring oscillator 302 to the clock generator 206. The differential calib signal (calib and calib_b) can be used to provide a PVT calibration. For example, a PVT calibration can be performed by observing the frequency of the unlocked ring oscillator 302 and altering the calib signal to bring the oscillation frequency near the injected frequency.

The pulse generator 310 generates a sequence pulses in response to the differential I and Q clock signals output by the ring oscillator 302. The pulses output by the pulse generator 310 are injected into the ILO 312, which outputs I and Q sampling clock signals.

Figure 4:
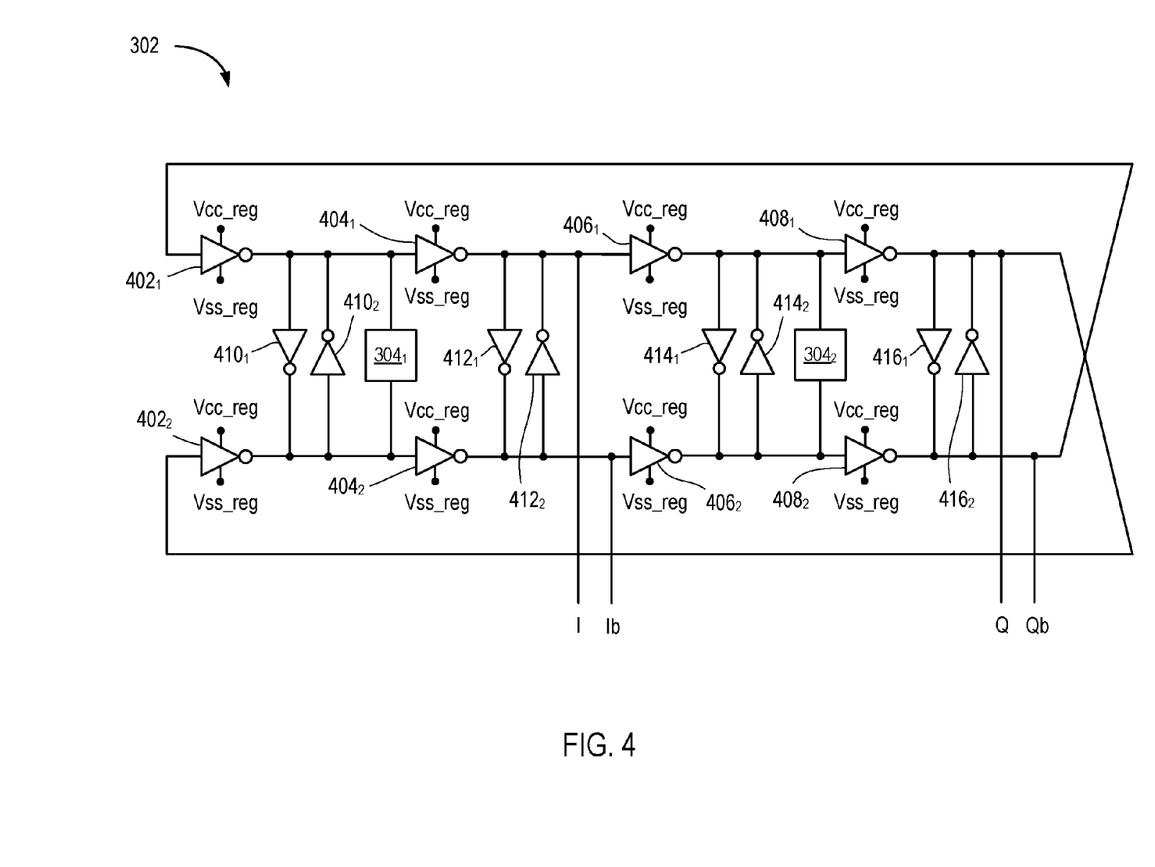
FIG. 4 is a schematic diagram depicting a ring oscillator according to an example.

FIG. 4 is a schematic diagram depicting the ring oscillator 302 according to an example. The ring oscillator 302 includes inverters $402_{1-2}$, $404_{1-2}$, $406_{1-2}$, and $408_{1-2}$. The inverter pair $402_{1-2}$ implements a first delay stage 305, the inverter pair $404_{1-2}$ implements a second delay stage 305, the inverter pair $406_{1-2}$ implements a third delay stage 305, and the inverter pair $408_{1-2}$ implements a fourth delay stage 305. The inverters $402_1$ through $408_1$ are coupled in series output-to-input. Likewise, the inverters $402_2$ through $408_2$ are coupled in series output-to-input. An output of the inverter $408_1$ is coupled to an input of the inverter $402_2$. An output of the inverter $408_2$ is coupled to an input of the inverter $402_1$. Each of the inverters 402 receives the supply voltage Vcc_reg and the ground voltage Vss_reg.

The ring oscillator 302 also includes a first cross-coupled pair of inverters $410_1$ and $410_2$, a second cross-coupled pair of inverters $412_1$ and $412_2$, a third cross-coupled pair of inverters $414_1$ and $414_2$, and a fourth cross-coupled pair of inverters $416_1$ and $416_2$. The first cross-coupled pair of inverters 410 is coupled between the output of the inverter $402_1$ and the output of the inverter $402_2$. The second cross-coupled pair of inverters 412 is coupled between the output of the inverter $404_1$ and the output of the inverter $404_2$. The third cross-coupled pair of inverters 414 is coupled between the output of the inverter $406_1$ and the output of the inverter $406_2$. The fourth cross-coupled pair of inverters 416 is coupled between the output of the inverter $408_1$ and the output of the inverter $408_2$. The cross-coupled inverter pairs are provided to satisfy the oscillation criteria of the ring oscillator 302.

The ring oscillator 302 includes two injection switches $304_1$ and $304_2$. The injection switch $304_1$ is coupled between the output of the inverter $402_1$ and the output of the inverter $402_2$. The injection switch $304_2$ is coupled between the output of the inverter $406_1$ and the output of the inverter $406_2$. The output of the inverter $404_1$ supplies the I clock signal, and the output of the inverter $404_2$ supplies the I_b clock signal. The output of the inverter $408_1$ supplies the Q clock signal, and the output of the inverter $408_2$ supplies the Q_b clock signal. In this manner, the ring oscillator 302 provides a divide-by-two ILO.

Figure 5:
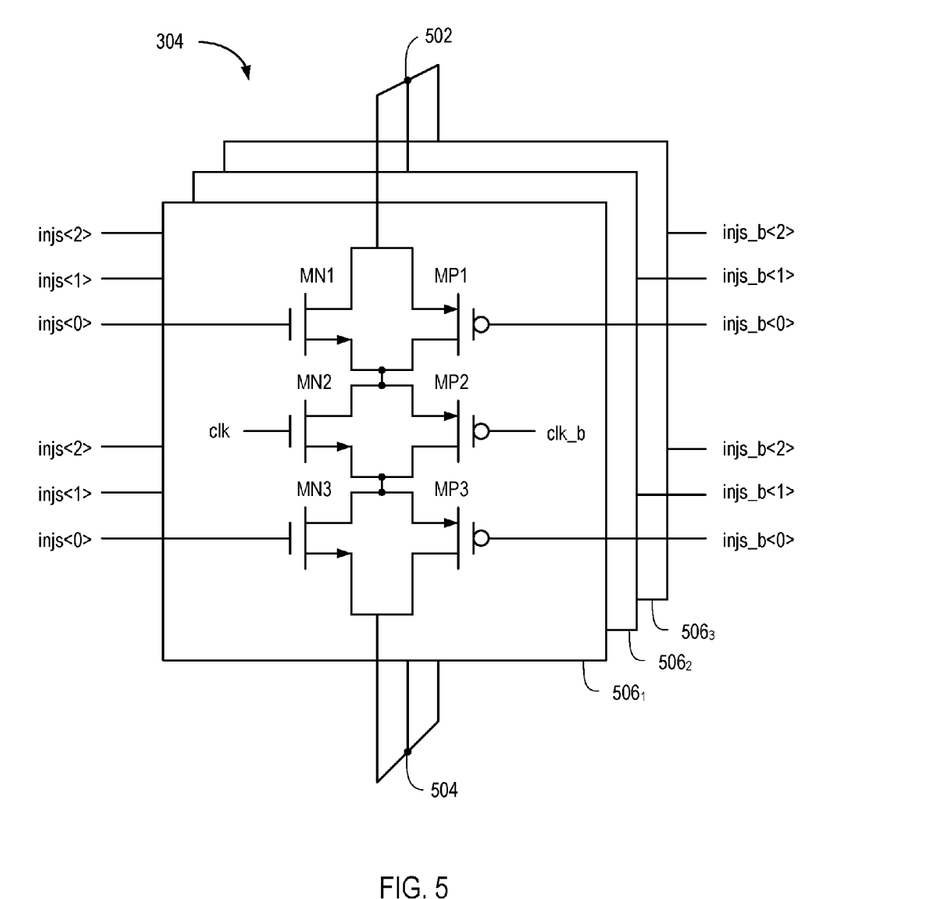
FIG. 5 is a schematic diagram depicting an injection switch according to an example.

FIG. 5 is a schematic diagram depicting an injection switch 304 according to an example. The injection switch 304 includes a plurality of stages 506, e.g., three stages $506_1$ through $506_3$. In such case, the injs signal includes K=3 bits (one per stage 506). Each stage 506 includes n-channel field effect transistors (FETs) MN1 through MN3 (e.g., N-type metal oxide semiconductor FETs (MOSFETs)) and p-channel FETs MP1 through MP3 (e.g., P-type MOSFETs). A drain of the transistor MN1 is coupled to a node 502. A source of the transistor MN1 is coupled to the drain of the transistor MN2. A source of the transistor MN2 is coupled to a drain of the transistor MN3. A source of the transistor MN3 is coupled to a node 504. A source of the transistor MP1 is coupled to the node 502. A drain of the transistor MP1 is coupled to a source of the transistor MP2. A drain of the transistor MP2 is coupled to a source of the transistor MP3. A drain of the transistor MP3 is coupled to the node 504. The source of the transistor MN1, the drain of the transistor MP1, the drain of the transistor MN2, and the source of the transistor MP2 is a common node. The source of the transistor MN2, the drain of the transistor MP2, the drain of the transistor MN3, and the source of the transistor MP3 is another common node.

For each stage 506, the gate of the transistor MN2 receives one component of the differential reference clock (e.g., clk) and the gate of the transistor MP2 receives the other component of the differential reference clock (e.g. clk_b). For the stages $506_1$ through $506_3$, the gate of each transistor MN1 receives a respective one of injs<0> through injs<2> (where injs<x> is the xth logic signal of the 3-bit injs signal). For the stages $506_1$ through $506_3$, the gate of each transistor MN3 receives a respective one of injs<0> through injs<2>. For the stages $506_1$ through $506_3$, the gate of each transistor MP1 receives a respective one of injs_b<0> through injs_b<2>. For the stages $506_1$ through $506_3$, the gate of each transistor MP3 receives a respective one of injs_b<0> through injs_b<2>.

In operation, the differential reference clock provided by the PLL 212 is coupled to the gates of the transistors MN2, MP2 in each stage 506. The injection switch 304 is coupled between inverter outputs at the nodes 502, 504. The differential injection signal injs controls the injection strength of the clock signal clk.

Figure 6:
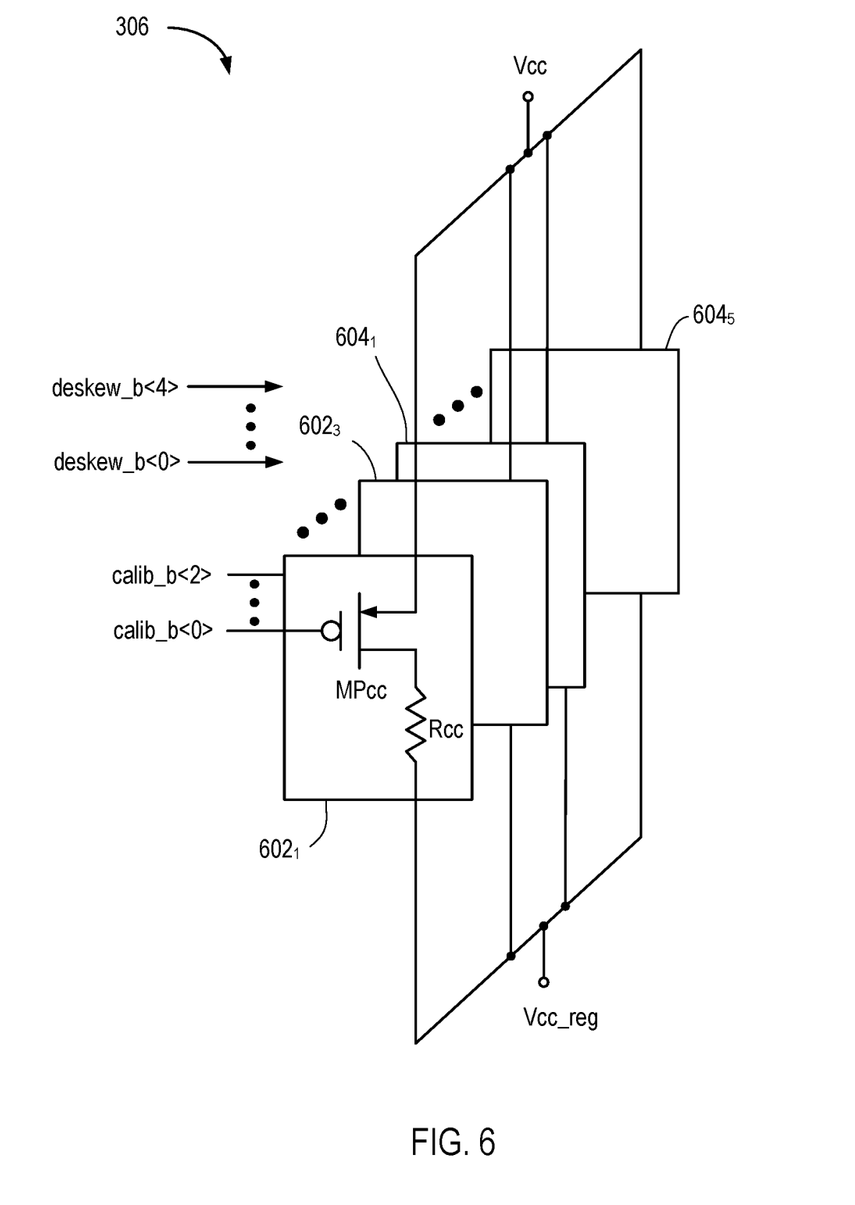
FIG. 6 is a schematic diagram depicting a supply control circuit according to an example.

FIG. 6 is a schematic diagram depicting the supply control circuit 306 according to an example. The supply control circuit 306 includes a first plurality of stages 602, e.g., stages $602_1$ through $602_3$. The supply control circuit 306 includes a second plurality of stages 604, e.g., stages $604_1$ through $604_5$. In such an example, the calib_b signal includes 3 bits (e.g., N=3) and the deskew_b signal includes 5 bits (e.g., M=5). Each stage 602, 604 includes a p-channel FET MPcc and a resistor Rcc. The source of the transistor MPcc is coupled to a supply voltage Vcc. A drain of the transistor MPcc is coupled to the resistor Rcc. The resistor Rcc is coupled between the drain of the transistor MPc and the node supplying the regulated voltage Vcc_reg. In the present example, the regulated supply voltage is generated using eight control bits (e.g., 3 bits of the calib signal and 5 bits of the deskew signal). The CDR circuit 210 provides the deskew signal and can also provide the calib signal. Alternatively, the calib signal can be provided by another control circuit. Adjusting the value of the deskew and calib signals adjusts the value of Vcc_reg, which in turn adjusts the oscillation frequency of the ring oscillator 302.

Figure 7:
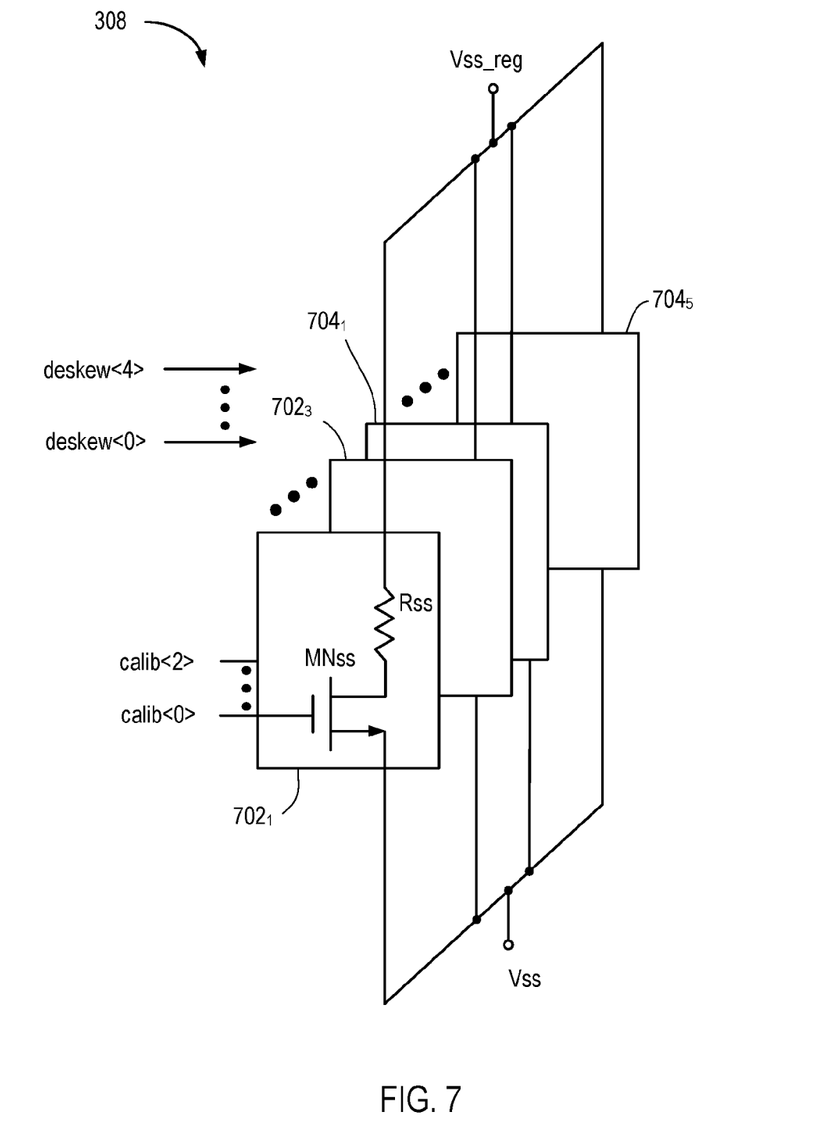
FIG. 7 is a schematic diagram depicting a ground control circuit according to an example.

FIG. 7 is a schematic diagram depicting the ground control circuit 308 according to an example. The ground control circuit 308 includes a first plurality of stages 702, e.g., stages $702_1$ through $702_3$. The ground control circuit 308 includes a second plurality of stages 704, e.g., stages $704_1$ through $704_5$. In such an example, the calib signal includes 3 bits (e.g., N=3) and the deskew signal includes 5 bits (e.g., M=5). Each stage 702, 704 includes an n-channel FET MNss and a resistor Rss. The source of the transistor MNss is coupled to a supply voltage Vss. A drain of the transistor MNss is coupled to the resistor Rss. The resistor Rss is coupled between the drain of the transistor MNss and the node supplying the regulated voltage Vss_reg. In the present example, the regulated ground voltage is generated using eight control bits (e.g., 3 bits of the calib signal and 5 bits of the deskew signal). The CDR circuit 210 provides the deskew signal and can also provide the calib signal. Alternatively, the calib signal can be provided by another control circuit. Adjusting the value of the deskew and calib signals adjusts the value of Vss_reg, which in turn adjusts the oscillation frequency of the ring oscillator 302.

Figure 8:
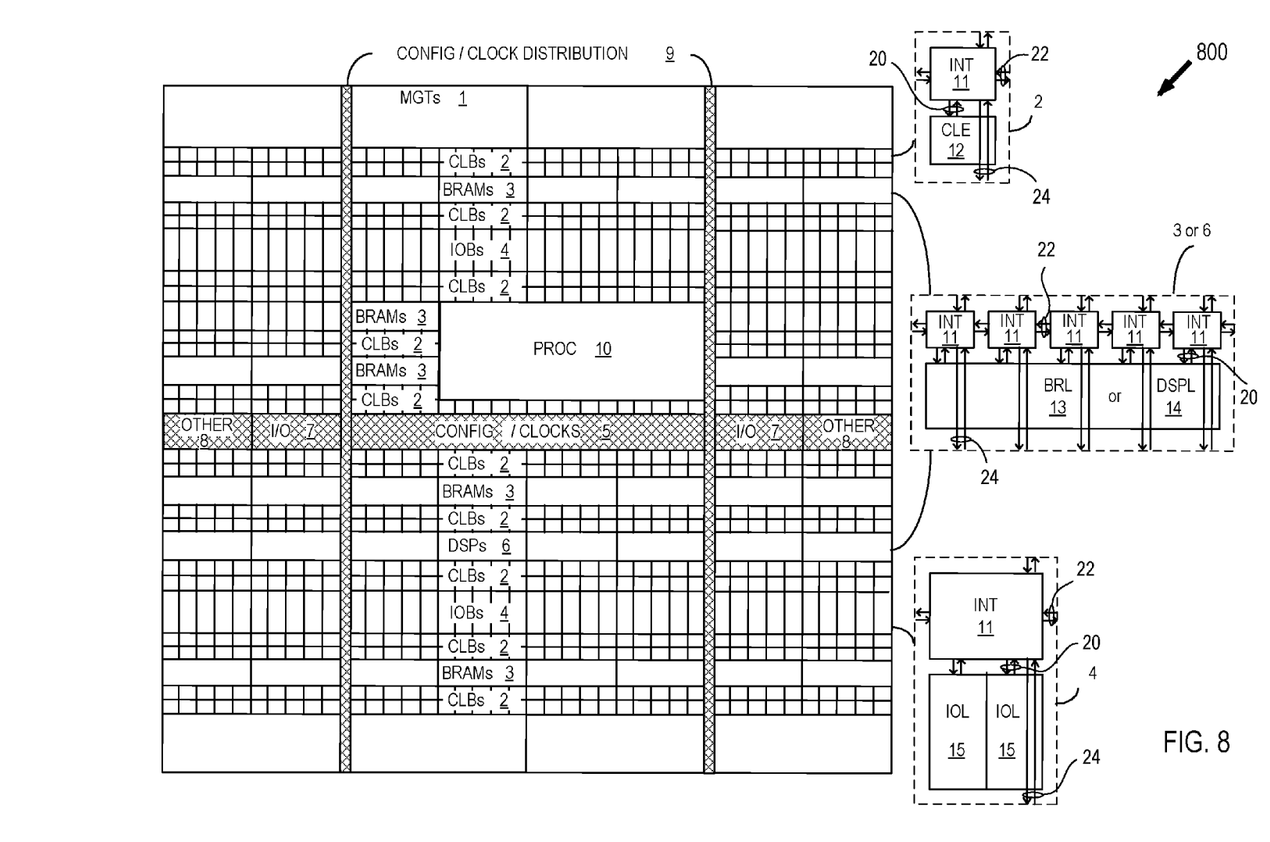
FIG. 8 illustrates an example field programmable gate array (FPGA) in which the phase interpolator described herein can be used.

The PI 104 described above can be implemented within an integrated circuit, such as a field programmable gate array (FPGA) or like type programmable circuit. FIG. 8 illustrates an architecture of FPGA 800 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 800 can include one or more instances of SerDes 122 described above.

In some FPGAs, each programmable tile can include at least one programmable interconnect element ("INT") 11 having connections to input and output terminals 20 of a programmable logic element within the same tile, as shown by examples included at the top of FIG. 8. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An 10B 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 8) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A phase interpolator, comprising:
   a ring oscillator having a plurality of delay stages and a plurality of injection switches, each of the plurality of injection switches responsive to a differential reference clock signal and a first differential control signal;
   a supply control circuit configured to provide a regulated supply voltage to the ring oscillator in response to a first component of a second differential control signal; and
   a ground control circuit configured to provide a regulated ground voltage to the ring oscillator in response to a second component of the second differential control signal.

2. The phase interpolator of claim 1, wherein each of the plurality of delay stages comprises:
   first and second inverters each receiving the regulated supply voltage and the regulated ground voltage; and
   a pair of cross-coupled inverters coupled between outputs of the first and second inverters.

3. The phase interpolator of claim 2, wherein each of the plurality of injection switches is coupled between the outputs of the first and second inverters in a respective one of the plurality of delay stages.

4. The phase interpolator of claim 1, wherein each of the plurality of injection switches comprises:
   a plurality of stages coupled between first and second nodes, wherein each of the plurality of stages comprises:
   first, second, and third transmission gates, the first transmission gate coupled between the first node and the second transmission gate, and the third transmission gate coupled between the second node and the second transmission gate.

5. The phase interpolator of claim 1, wherein the supply control circuit comprises:
   a first plurality of stages coupled between a first node and a second node;
   a second plurality of stages coupled between the first node and the second node;
   wherein each of the first plurality of stages and the second plurality of stages includes:
   a p-channel field effect transistor (FET) and a resistor, the p-channel FET having a source coupled to the first node, the resistor being coupled between a drain of the p-channel FET and the second node.

6. The phase interpolator of claim 1, wherein the ground control circuit comprises:
   a first plurality of stages coupled between a first node and a second node;
   a second plurality of stages coupled between the first node and the second node;
   wherein each of the first plurality of stages and the second plurality of stages includes:
   an n-channel field effect transistor (FET) and a resistor, the n-channel FET having a source coupled to the second node, the resistor being coupled between a drain of the n-channel FET and the first node.

7. The phase interpolator of claim 1, wherein the supply control circuit is configured to provide the regulated supply voltage to the ring oscillator in response to a first component of a third differential control signal in addition to the first component of the second differential control signal, and wherein the ground control circuit is configured to provide the regulated ground voltage to the ring oscillator in response to a second component of the third differential control signal in addition to the second component of the second differential control signal.

8. The phase interpolator of claim 1, wherein the ring oscillator is configured to divide a frequency of the differential reference clock signal by two.

9. A receiver, comprising:
   sampling circuitry configured to sample an input signal based on a plurality of sampling clock signals;
   a clock and data recovery (CDR) circuit configured to generate a control signal in response to data and error samples output by the sampling circuitry;
   a clock generator configured to generate the plurality of sampling clock signals; and
   a phase interpolator configured to provide a plurality of clock signals to the clock generator in response to the control signal from the CDR circuit, the phase interpolator comprising:
   a ring oscillator having a plurality of delay stages and a plurality of injection switches, each of the plurality of injection switches responsive to a differential reference clock signal and a first differential control signal;
   a supply control circuit configured to provide a regulated supply voltage to the ring oscillator in response to a first component of a second differential control signal; and
   a ground control circuit configured to provide a regulated ground voltage to the ring oscillator in response to a second component of the second differential control signal.

10. The receiver of claim 9, wherein each of the plurality of delay stages comprises:
    first and second inverters each receiving the regulated supply voltage and the regulated ground voltage; and a pair of cross-coupled inverters coupled between outputs of the first and second inverters.

11. The receiver of claim 10, wherein each of the plurality of injection switches is coupled between the outputs of the first and second inverters in a respective one of the plurality of delay stages.

12. The receiver of claim 9, wherein each of the plurality of injection switches comprises:
a plurality of stages coupled between first and second nodes, wherein each of the plurality of stages comprises:
first, second, and third transmission gates, the first transmission gate coupled between the first node and the second transmission gate, and the third transmission gate coupled between the second node and the second transmission gate.

13. The receiver of claim 9, wherein the supply control circuit comprises:
a first plurality of stages coupled between a first node and a second node;
a second plurality of stages coupled between the first node and the second node;
wherein each of the first plurality of stages and the second plurality of stages includes:
a p-channel field effect transistor (FET) and a resistor, the p-channel FET having a source coupled to the first node, the resistor being coupled between a drain of the p-channel FET and the second node.

14. The receiver of claim 9, wherein the ground control circuit comprises:
a first plurality of stages coupled between a first node and a second node;
a second plurality of stages coupled between the first node and the second node;
wherein each of the first plurality of stages and the second plurality of stages includes:
an n-channel field effect transistor (FET) and a resistor, the n-channel FET having a source coupled to the second node, the resistor being coupled between a drain of the n-channel FET and the first node.

15. The receiver of claim 9, wherein the supply control circuit is configured to provide the regulated supply voltage to the ring oscillator in response to a first component of a third differential control signal in addition to the first component of the second differential control signal, and wherein the ground control circuit is configured to provide the regulated ground voltage to the ring oscillator in response to a second component of the third differential control signal in addition to the second component of the second differential control signal.

16. The receiver of claim 1, wherein the ring oscillator is configured to divide a frequency of the differential reference clock signal by two.

17. A method of phase interpolation, comprising:
providing a differential reference clock signal and a first differential control signal to a plurality of injection switches in a ring oscillator;
providing a regulated supply voltage to the ring oscillator in response to a first component of a second differential control signal; and
providing a regulated ground control voltage to the ring oscillator in response to a second component of the second differential control signal.

18. The method of claim 17, wherein the ring oscillator includes a plurality of delay stages, and wherein the method further comprises:
receiving the regulated supply voltage and the regulated ground voltage at first and second inverters in each of the plurality of delay stages.

19. The method of claim 17, the regulated supply voltage is provided to the ring oscillator in response to a first component of a third differential control signal in addition to the first component of the second differential control signal, and wherein the regulated ground voltage is provided to the ring oscillator in response to a second component of the third differential control signal in addition to the second component of the second differential control signal.

20. The method of claim 17, wherein the ring oscillator is configured to divide a frequency of the differential reference clock by two.

* * * * *